United States Patent [19]

Honda

[11] Patent Number: 4,976,988
[45] Date of Patent: Dec. 11, 1990

[54] VACUUM EVAPORATION METHOD FOR ZINC SULFIDE

[75] Inventor: Naoki Honda, Yokosuka, Japan

[73] Assignee: Nissan Motor Co., Ltd., Yokohama, Japan

[21] Appl. No.: 511,970

[22] Filed: Apr. 17, 1990

Related U.S. Application Data

[63] Continuation of Ser. No. 148,952, Jan. 27, 1988, abandoned.

[30] Foreign Application Priority Data

Feb. 3, 1989 [JP] Japan .................................. 62-21780

[51] Int. Cl.$^5$ ...................... C23C 14/00; C23C 14/24; C23C 14/26; C23C 14/30
[52] U.S. Cl. ........................................ 427/42; 427/49; 427/50; 427/69; 427/70; 427/77; 427/78; 427/255.2
[58] Field of Search ....................... 427/35, 42, 64, 66, 427/69, 70, 77, 255.1, 255.2, 49, 50

[56] References Cited

U.S. PATENT DOCUMENTS 3,113,040 12/1963 Winston ................................ 427/66
3,431,134 3/1969 Thornton .............................. 427/66
3,889,016 6/1975 Vlasenko et al. ..................... 428/66
4,482,799 11/1984 Pricenski et al. ................... 118/726
4,879,139 11/1989 Ootsuka et al. ....................... 427/66

FOREIGN PATENT DOCUMENTS 57-99723 6/1982 Japan .
58-157886 9/1983 Japan .
60-67666 4/1985 Japan .
001131 of 1879 United Kingdom ............. 423/566.1

OTHER PUBLICATIONS

Bunshait et al, *Deposition Technologies for Films and Coatings*, (Noyes, Pk. Ridge, N.J.) c. 1982, pp. 95-121.
Maissel et al, *Handbook of Thin Film Technology*, (McGraw-Hill, N.Y.), c. 1970, pp. 15-5-15-7.
Pulker, *Coatings on Glass*, (Elsevier, Oxford), c. 1984, pp. 190-199.

Primary Examiner—Norman Morgenstern
Assistant Examiner—Margaret Bueker
Attorney, Agent, or Firm—Foley & Lardner, Schwartz, Jeffery, Schwaab, Mack, Blumenthal & Evans

[57] ABSTRACT

In a vacuum evaporation method for depositing a thin film on a substrate by heating a sublimable source material under vacuum to vaporize it, the source material is subjectd to vaporization in an unsintered state. Electron-beam heating may be employed. The primary advantage of avoiding precedent sintering of the source material is great reduction in scattering of fine particles of the source material in the vacuum chamber. Consequently the deposited film has an even and smooth surface. A representative of the sublimable source material is a II-VI compound semiconductor such as ZnS used as the host material of an electroluminescent phosphor. Thin-film electroluminsecent devices produced by using the vacuum evaporation method according to the invention possess improved reliability.

2 Claims, 2 Drawing Sheets

VACUUM EVAPORATION METHOD FOR ZINC SULFIDE

This application is a continuation of application Ser. No. 148,952, filed Jan. 27, 1988, now abandoned.

BACKGROUND OF THE INVENTION

This invention relates to a vacuum evaporation method using a sublimable source material for depositing a thin film on a substrate. For example, the method according to the invention is advantageously applicable to the deposition of a light emitting film in a thin-film electroluminescent device.

Vacuum evaporation is one of the prevailing techniques for depositing thin films of metals, semiconductors or dielectrics on various substrates. Either resistance heating or electron-beam heating is employed for heating the evaporant source material in vacuum. The vacuum evaporation technique has merits such as simplicity of the deposition apparatus, high rate of growth of film on the substrate and consequential success in growth to a desired film thickness with little contamination attributed to foreign matter in the vacuum chamber, and ease of forming a desirably patterned film by placement of a suitably apertured mask in front of the substrate surface. Accordingly vacuum evaporation is widely used for forming thin films of, for example, II-VI compound semiconductors such as ZnS, ZnSe, CdS and CaSe to serve as semiconductor layers in thin-film transistors or light emitting layers in thin-film electroluminescent (EL) devices.

As a problem common to deposition of films of II-VI compound semiconductors by vacuum evaporation, the evaporant source material heated in vacuum for vaporization is partly scattered as fine particles, and some of the scattered particles collide against the substrate on which a film is being deposited. As a result, the surface of the deposited film is often studded with particles of several microns and therefore becomes an uneven and rough surface. In the case of forming a thin film of a compound semiconductor such as the light emitting film in a thin-film EL device on an insulator film and then laying the semiconductor film with another insulator film, it is probable that the scattered particles of the source material break through the underlying insulator film and/or the overlaid insulator film to cause break of insulation in several spots (so-called self-healing type breakdown), and in some cases such breaking may grow to the extent of destruction of most of the picture elements (so-called propagation type breakdown).

To solve the above problem, it was proposed (e.g. JP-A No. 57-99723) to place a mesh which allows vapor to pass therethrough but blocks the advance of the scattered solid particles between the substrate in the vacuum chamber and the source material to be evaporated. However, when such a screening mesh is used it becomes difficult to maintain uniformity of thickness of the deposited film as the mesh is gradually clogged with the trapped particles. If the power of the electron-beam generator is raised as a compensating measure for keeping a constant rate of growth of the deposited film, the result is failure to obtain films of uniform characteristics by reason of a change in the evaporating temperature. Besides, there is a limit to the size of particles which the screening mesh can intercept.

In the manufacture of thin-film EL devices by using a vacuum evaporation method it is wished to form a thin film of an electroluminescent phosphor with even surfaces and without pinholes. To meet the wish it is known (JP-A No. 58-157886) to form the phosphor on the substrate by simultaneously but separately evaporating the host material of a II-VI compound semiconductor and an activator. That is, an activator such as Mn, Cu, Ag, Tb or Sm itself is evaporated by heating under vacuum while a sintered body of, for example, ZnS containing no activator is evaporated by electron-beam heating.

However, even by this method it is inevitable that the host material in the form of a sintered body is partly crumbled and scattered in the vacuum chamber as fine particles, some of which arrive at the substrate surface and cause roughening of the surface of the deposited film. This phenomenon is significant when electron-beam heating is employed since crumbling of the sintered body and scattering of the resultant particles are promoted by bumping of gas in the interior of the sintered body and electrification of the crumbled material. This phenomenon becomes serious also when the evaporant source material is a sublimable substance.

In thin-film EL devices the inclusion of the above described fine particles often causes dielectric breakdown of the device or internal separation at the interface between the light emitting layer and an adjacent insulating layer. It is desired that the scattering of fine particles in the vacuum chamber should be extremely suppressed by an easily practicable technique.

SUMMARY OF THE INVENTION

It is an object of the present invention to provide an improved vacuum evaporation method using a sublimable source material, by which a thin film having an even and smooth surface can be deposited on a substrate without serious influence of scattering of fine particles of the source material in the vacuum chamber.

The present invention provides a vacuum evaporation method for depositing a thin film on a substrate by heating a sublimable source material in vacuum to vaporize the source material, characterized in that the source material is heated in an unsintered state.

When a sublimable substance is used as an evaporant source material in a vacuum evaporation method, the source material continues to vaporize from its solid surface without assuming a molten or fused state. In conventional vacuum evaporation methods the sublimable source material is in the form of a sintered body prepared by compacting a powder of the source material and firing the compacted material, and it is inevitable that the sublimation of the sintered material is accompanied by partial crumbling of the sintered body and resultant scattering of solid particles of the source material in the vacuum chamber.

In the present invention the sublimable source material is subjected to vacuum evaporation without sintering it in advance. By vaporizing the sublimable source material in an unsintered state it is possible to remarkably reduce scattering of solid particles of the source material in the vacuum chamber even when electron-beam heating is employed for vaporizing the source material. Therefore, it is possible to form a thin film having a very even and smooth surface without serious influence of scattered solid particles. The sublimable source material for use in this method may be either crystalline or amorphous.

The vacuum deposition method according to the invention is particularly favorable, though not limitative, for application to deposition of a compound semiconductor film such as an electroluminescent phosphor film in a thin-film EL device. In this method it is possible to simultaneously vaporize a sublimable source material such as, for example, a II-VI compound semiconductor and another source material which is not sublimable, such as a metal element to be introduced into the compound semiconductor as an activator. By using this vacuum depostion method, thin-film EL devices of improved reliability can be produced since probabilities of dielectric breakdown and inter-layer separation are greatly reduced.

DESCRIPTION OF THE PREFERRED EMBODIMENTS

A conventional vacuum evaporation apparatus can be used for a method according to the invention.

Figure 1:
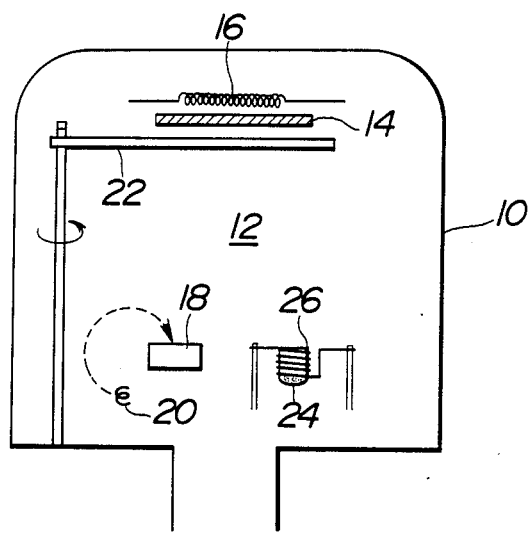
FIG. 1 is a schematic and longitudinally sectional illustration of an example of vacuum evaporation apparatus used in the present invention.

FIG. 1 shows an example of vacuum evaporation apparatus using a bell jar type vessel 10 to provide a vacuum chamber 12. Numeral 14 indicates a substrate on which a thin film is to be deposited. There is a heater 16 to keep the substrate 14 at a predetermined temperature. An evaporant source material 18 is placed in the vacuum chamber 12 at a suitable distance from the substrate 14, and there is an electron-beam generator 20 as a means for heating the source material 18. A swivel shutter 22 is disposed in front of the substrate 14 to intercept advance of solid particles to the substrate 14.

To form a compound semiconductor film as the light emitting layer in a thin-film EL device by using, for example, ZnS or ZnSe as the host material and, for example, Mn as an activator which gives rise to electroluminescent centers, the host material in an unsintered state is placed as the source material 18 in FIG. 1. Besides, the activator element in the form of flakes 24 is placed in a crucible 26 provided with resistance heating means. The form of the unsintered host material 18 may be single crystal, polycrystal or amorphous, and it can be prepared by an arbitrary method such as a chemical vapor deposition method, Czochralski method, floating zone method or melting-solidifying method. The substrate 14 is precedently laid with an insulator film (not shown).

By irradiation with an electron beam from the generator 20 the host material 18 is heated to gradually vaporize by sublimation. Simultaneously the activator 24 in the crucible 26 is heated by energizing the resistance wire heater. In this case it is suitable to vaporize 100 parts by weight of the host material 18 such as ZnS and 0.01 to 10 parts by weight of the activator 24 such as Mn per unit time. By such vacuum evaporation operation a thin film of an electroluminescent phosphor, such as ZnS containing 0.01-10 wt % of Mn, is deposited on the substrate 14. By virtue of sublimating the host material 18 in an unsintered state, the obtained film has an even and smooth surface.

Figure 2:
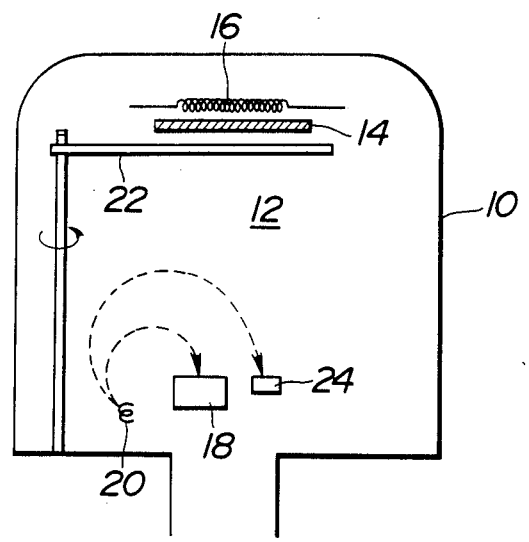
FIG. 2 shows a modification of the heating means in the apparatus of FIG. 1.

Also it is possible to heat both the sublimable host material 18 and the activator 24 by electron-beam heating. In the embodiment shown in FIG. 2, the electron beam generator 20 is modified so as to alternately irradiate the host material 18 and the activator 24 with an electron beam. At each cycle of the alternating irradiation the host material 18 is irradiated for a longer time than the activator 24 such that the two materials 18, 24 vaporize in a suitable proportion as mentioned above. There is no difference between the method of FIG. 2 and the method of FIG. 1 in goodness of the surface of the obtained film.

Figure 3:
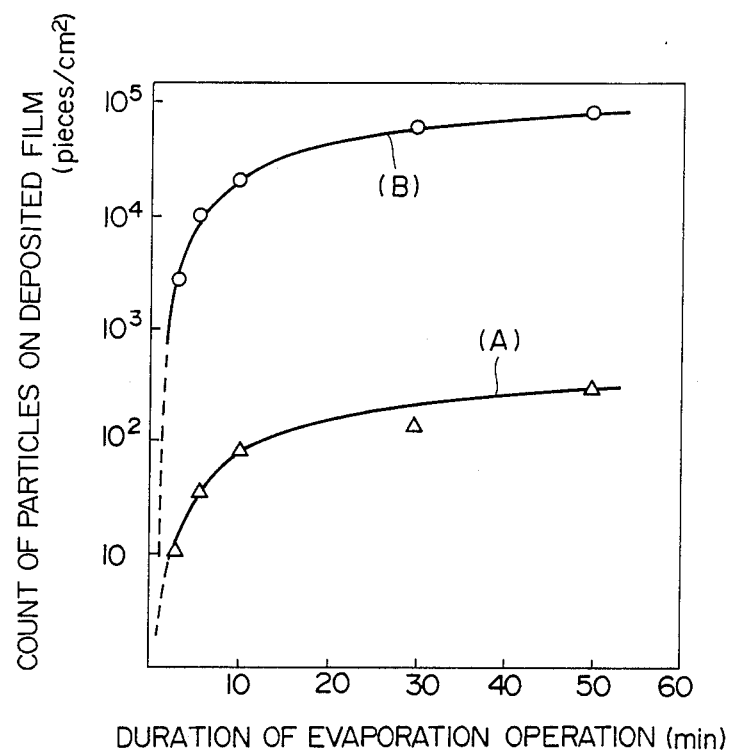
FIG. 3 is a graph showing the number of fine particles existing on a thin film deposited by the method according to the invention as a function of duration of the vacuum evaporation operation and in comparison with an analogous film deposited by a conventional method using a sintered source material.

As a comparative test, a film of ZnS:Mn was vacuum-deposited by the method according to the invention (illustrated in FIG. 1), and another film of ZnS:Mn was deposited in the same apparatus by using a sintered body of ZnS as the source material (18) to be evaporated. In both cases the duration of the vacuum evaporation operation was variable, and the number of fine particles existing on the surface of the deposited film was examined. The results were as shown in FIG. 3, wherein the curve (A) represents the method according to the invention and the curve (B) the conventional method using sintered ZnS. As can be seen in the graph, the count of particles over 1 cm$^2$ of the film surface amounted to $10^4$-$10^5$ in the case of the conventional method and reduced to $10^2$-$10^3$ in the case of the method of the invention. That is, by using the present invention the amount of the scattered particles reduced to about 1/500 to 1/1000 of the usual level.

As to the electroluminescent threshold voltage and the maximum brightness there was little difference between two thin-film EL devices produced by using the conventional method and the method of the invention, respectively. As to the dielectric strength, propagation type breakdown was never observed in samples of the EL device produced by using the invention, though self-healing type breakdown was observed almost similarly in both samples of the EL device produced by using the conventional method and samples of the EL device using the invention.

What is claimed is:

1. A method for depositing a thin film of an electroluminescent phosphor on a substrate, said electroluminescent phosphor being ZnS doped with a metal element that serves as an activator, comprising the steps of:
   (a) placing said substrate in a vacuum chamber and separately placing an unsintered crystalline mass of ZnS prepared by a chemical vapor deposition method, a Czochralski method, a floating zone method, or a melting zone method, or melting-solidifying method and said metal element in said vacuum chamber;
   (b) heating said crystalline mass of ZnS by an electron beam in vacuum thereby evaporating said crystalline mass of ZnS whereby scattering of fine particles of the ZnS is reduced; and
   (c) heating said metal element by an electron beam in vacuum so as to evaporate said metal element substantially simultaneously with the evaporation of said ZnS.

2. A method as claimed in claim 1, wherein said metal element is Mn.

* * * * *